(12) United States Patent
Song et al.

(10) Patent No.: US 10,842,021 B1
(45) Date of Patent: Nov. 17, 2020

(54) PRINTED CIRCUIT BOARD

(71) Applicant: SAMSUNG ELECTRO-MECHANICS CO., LTD., Suwon-si, Gyeonggi-do (KR)

(72) Inventors: Seung Jae Song, Suwon-si (KR); Seong Hee Choi, Suwon-si (KR); Sang Jong Lee, Suwon-si (KR); Mi Ja Han, Suwon-si (KR)

(73) Assignee: SAMSUNG ELECTRO-MECHANICS CO. LTD., Suwon-si (KR)

( * ) Notice: Subject to any disclaimer, the term of this patent is extended or adjusted under 35 U.S.C. 154(b) by 0 days.

(21) Appl. No.: 16/801,924

(22) Filed: Feb. 26, 2020

(30) Foreign Application Priority Data

Dec. 10, 2019 (KR) .................. 10-2019-0163690

(51) Int. Cl.
| | |
|---|---|
| *H05K 1/16* | (2006.01) |
| *H01F 5/00* | (2006.01) |
| *H05K 1/11* | (2006.01) |
| *H01F 27/28* | (2006.01) |
| *H01F 27/24* | (2006.01) |

(52) U.S. Cl.
CPC ............... *H05K 1/165* (2013.01); *H01F 5/00* (2013.01); *H01F 27/24* (2013.01); *H01F 27/2804* (2013.01); *H05K 1/115* (2013.01); *H01F 2027/2809* (2013.01); *H05K 2201/086* (2013.01)

(58) Field of Classification Search
CPC H01F 5/00; H01F 5/003; H01F 10/08; H05K 1/165; H05K 1/115
See application file for complete search history.

(56) References Cited

U.S. PATENT DOCUMENTS 10,290,414 B2   5/2019   Yun et al.
2017/0103845 A1*  4/2017   Nagai ................ H01F 27/2804

FOREIGN PATENT DOCUMENTS

| JP | 4475965 B2 | 6/2010 |
|---|---|---|
| JP | 6084836 B2 | 2/2017 |
| KR | 10-2017-0108581 A | 9/2017 |

* cited by examiner

*Primary Examiner* — Jeremy C Norris
(74) *Attorney, Agent, or Firm* — Morgan, Lewis & Bockius LLP (57) ABSTRACT

A printed circuit board includes a magnetic member including a magnetic layer, a first coil pattern disposed above the magnetic member, and having a planar spiral structure, and a second coil pattern disposed below the magnetic member, and having a planar spiral structure.

20 Claims, 8 Drawing Sheets

PRINTED CIRCUIT BOARD

CROSS-REFERENCE TO RELATED APPLICATION(S)

This application claims benefit of priority to Korean Patent Application No. 10-2019-0163690 filed on Dec. 10, 2019 in the Korean Intellectual Property Office, the disclosure of which is incorporated herein by reference in its entirety.

TECHNICAL FIELD

The present disclosure relates to a printed circuit board.

BACKGROUND

Central Processing Units (CPUs), Application Specific Integrated Circuits (ASICs), Application Processors (APs), and the like, receive power from Power Management Integrated Circuits (PMICs), and recently, a PMIC's power supply switching frequency is increasing in order to improve power efficiency. Thus, there is demand for a package substrate in a form of a multilayer printed circuit board having an inductor function. Thus, there is demand for a package substrate in a form of a multilayer printed circuit board having an inductor function.

SUMMARY

An aspect of the present disclosure is to provide a printed circuit board having an inductor function by which permeability may be kept high, even at high frequencies.

As a method for solving the above-described problems, according to an aspect of the present disclosure, a novel structure of a printed circuit board is proposed, and specifically, the printed circuit board includes: a magnetic member including a magnetic layer; a first coil pattern disposed above the magnetic member, and including a planar spiral structure; and a second coil pattern disposed below the magnetic member, and including a planar spiral structure.

In an embodiment, the printed circuit board may further include: a core layer having a through portion, and a build-up layer covering at least a portion of each of the core layer, the magnetic member, and the first coil pattern, and filling at least a portion of the through portion.

In an embodiment, the magnetic member may be disposed in the through portion.

In an embodiment, the magnetic member may be provided as a plurality of magnetic members, a portion of the plurality of magnetic members may be disposed in the through portion, a portion of remaining magnetic members may be disposed outside of the build-up layer.

In an embodiment, the first and second coil patterns may be provided in a plurality of the planar spiral structures, respectively, and the plurality of planar spiral structures may be stacked in a thickness direction of the printed circuit board.

In an embodiment, each of the plurality of planar spiral structures in the first and second coil patterns may be connected to each other by conductive vias.

In an embodiment, the first and second coil patterns may include two pads for electrical connections, respectively, and the first and second coil patterns may not be directly connected.

In an embodiment, the first and second coil patterns may be connected by conductive vias.

In an embodiment, the conductive vias may be disposed to be adjacent to a side surface of the magnetic member.

In an embodiment, the conductive vias may connect outermost end portions of each of the first and second coil patterns.

In an embodiment, the conductive vias may be formed to penetrate the magnetic member.

In an embodiment, the conductive vias may connect innermost end portions of each of the first and second coil patterns.

In an embodiment, the printed circuit board may further include first and second core via layers disposed on one surface and the other surface of the core layer, respectively, and in which at least a portion thereof is covered by the build-up layer, respectively, and a core via layer penetrating at least a portion of the core layer.

In an embodiment, the magnetic member may include a base layer and the magnetic layer disposed on the base layer.

In an embodiment, the base layer may be a substrate containing silicon (Si).

In an embodiment, the magnetic layer may include a cobalt-tantalum-zirconium alloy.

In an embodiment, the each of the magnetic member, the first coil pattern, and the second coil pattern may be embedded in the printed circuit board.

In an embodiment, a printed circuit board includes a core layer; a plurality of build-up layers and a plurality of wiring layers disposed on opposing sides of the core layer; a magnetic member including a magnetic layer and embedded in the core layer; and a first coil pattern and a second coil pattern each having a planar spiral structure and overlapping the magnetic member in a stacking direction of the plurality of build-up layers. The first coil pattern is directly disposed on one of the build-up layer on which one of the plurality of wiring layers is directly disposed, and the second coil pattern is directly disposed on another of the build-up layer on which another of the plurality of wiring layers is directly disposed.

In an embodiment, the first and second coil patterns may be connected to each other through a via penetrating through at least the magnetic member.

In an embodiment, the first and second coil patterns may be connected to each other through a via extending in the stacking direction in a region outside the magnetic member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings. The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity. Further, in the drawings, elements having the same functions within the same scope of the inventive concept will be designated by the same reference numerals.

Electronic Device

Figure 1:
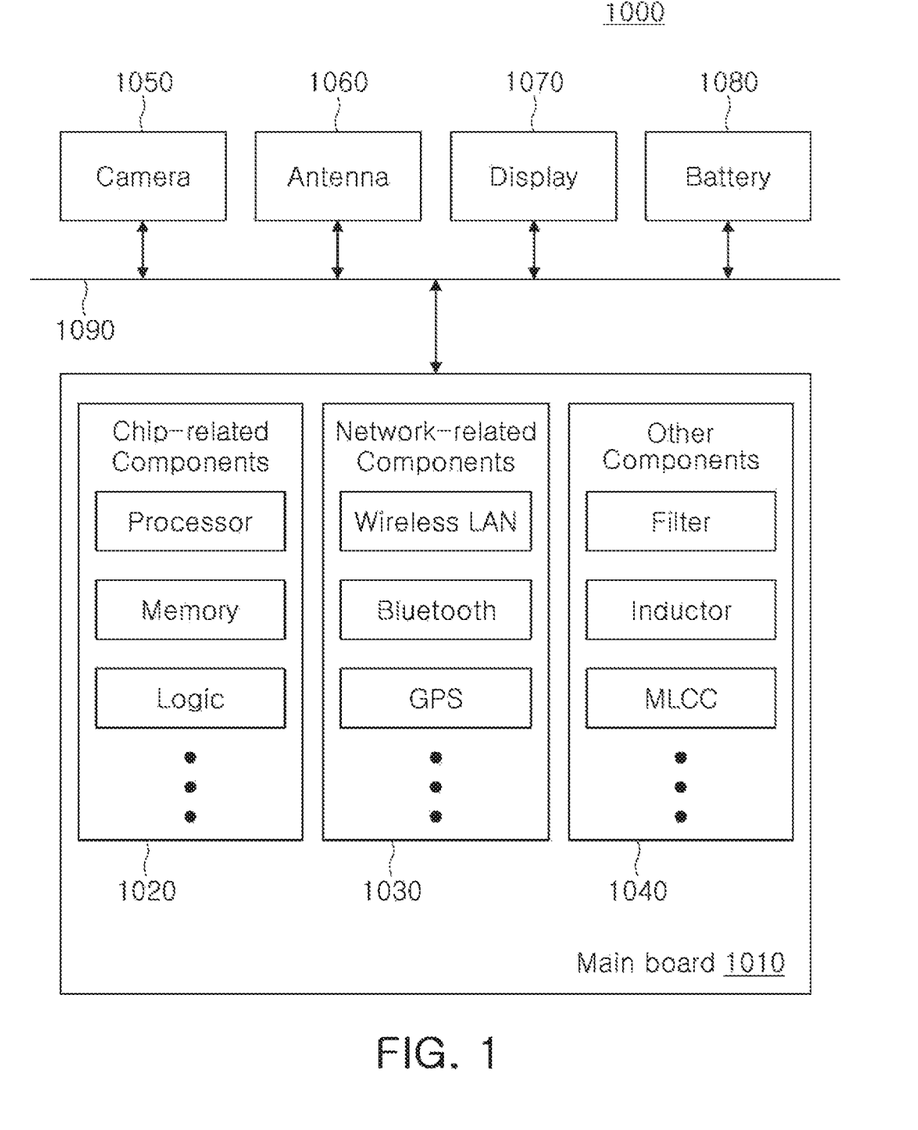
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010. The main board 1010 may include chip related components 1020, network related components 1030, other components 1040, or the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, and may include other types of chip related components. In addition, the chip-related components 1020 may be combined with each other. The chip-related components 1020 may be in package form including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 and/or the network related components 1030 described above.

Depending on a type of the electronic device 1000, the electronic device 1000 includes other components that may or may not be physically and/or electrically connected to the main board 1010. These other components may include, for example, a camera module 1050, an antenna module 1060, a display 1070, a battery 1080. However, the present disclosure is not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
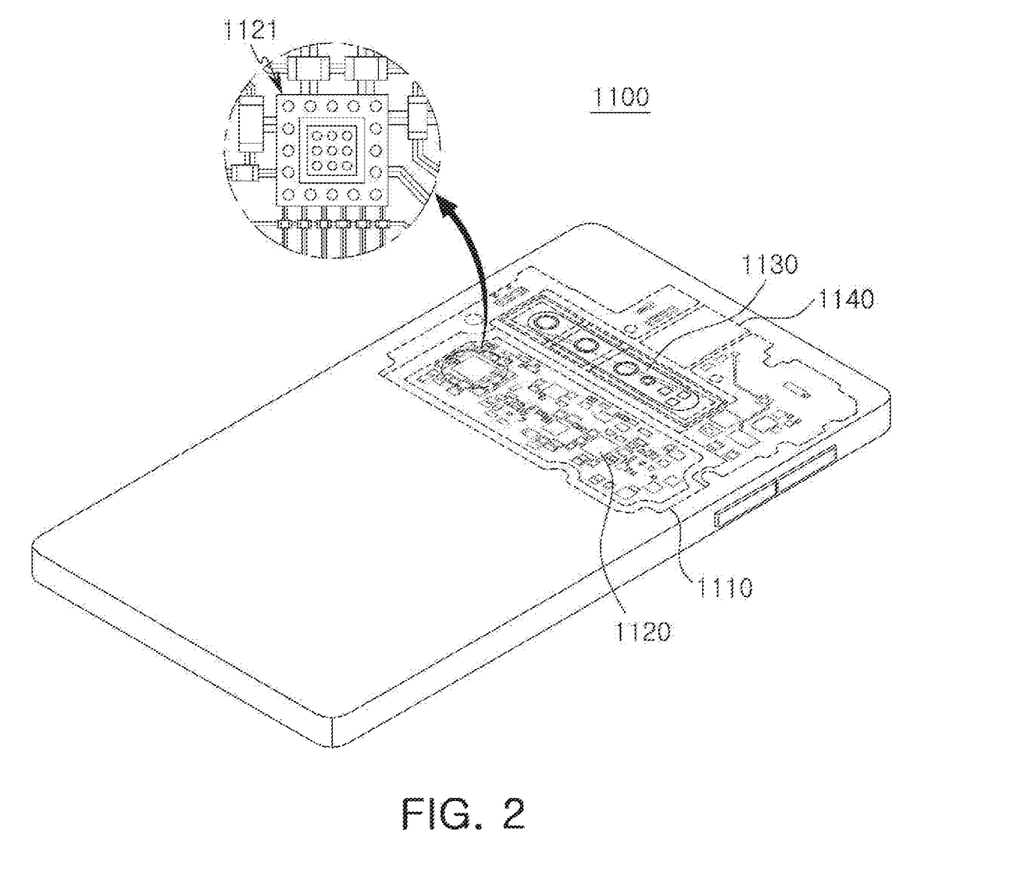
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board

Figure 3:
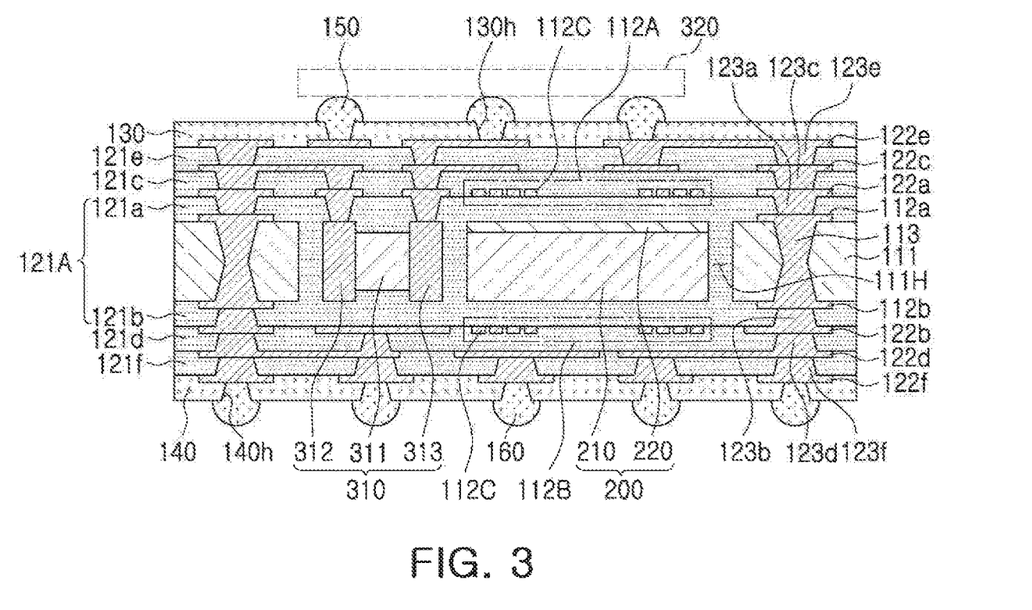
FIG. 3 is a schematic cross-sectional view illustrating an example of a printed circuit board.

FIG. 3 is a schematic cross-sectional view illustrating an example of a printed circuit board.

Figure 4:
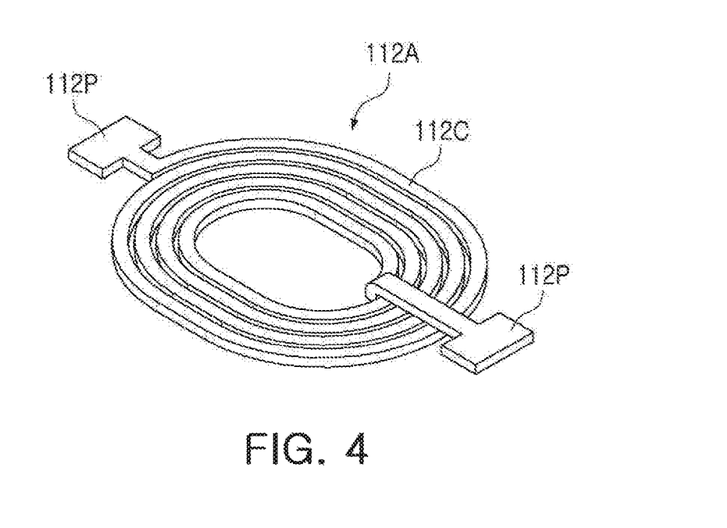
FIG. 4 is a schematic plan view illustrating an example of a coil pattern applied to the printed circuit board of FIG. 3.

FIG. 4 is a schematic plan view illustrating an example of a coil pattern applied to the printed circuit board of FIG. 3.

Referring to FIGS. 3 and 4, a printed circuit board 100 according to an example may include a magnetic member 200 including a magnetic layer, and a first coil pattern 112A and a second coil pattern 112B disposed in upper and lower portions thereof, respectively. In this case, the first and second coil patterns 112A and 112B may have a spiral coil structure. Hereinafter, detailed components that may be provided in the printed circuit board 100 will be described in detail.

The printed circuit board 100 may include a plurality of insulating layers 111, 121a, 121b, 121c, 121d, 121e, and 121f, a plurality of wiring layers 112a, 112b, 122a, 122b, 122c, 122d, 122e, and 122f, and a plurality of via layers 113, 123a, 123b, 123c, 123d, 123e, and 123f, and in this case, a magnetic member 200 may be embedded in the plurality of insulating layers 111, 121a, 121b, 121c, 121d, 121e, and 121f.

For example, a printed circuit board 100 according to an example may include a core layer 111, first and second core wiring layers 112a and 112b disposed on upper and lower surfaces of the core layer 111, respectively, a core via layer 113 penetrating at least a portion of the core layer 111, a first build-up layer 121A covering both surfaces of the core layer 111, a first wiring layer 122a disposed on an upper surface of an upper insulating layer 121a of the first build-up layer 121A, a second wiring layer 122b disposed on a lower surface of a lower insulating layer 121b of the first build-up layer 121A, a first via layer 123a penetrating at least a portion of the upper insulating layer 121a of the first build-up layer 121A, a second via layer 123b penetrating at least a portion of the lower insulating layer 121b of the first build-up layer 121A, a second build-up layer 121c disposed on the upper surface of the upper insulating layer 121a of the first build-up layer 121A, a third wiring layer 122c disposed on the upper surface of the second build-up layer 121c, a third via layer 123c penetrating at least a portion of the second build-up layer 121c, a third build-up layer 121d disposed on the lower surface of the lower insulating layer 121b of the first build-up layer 121A, a fourth wiring layer 122d disposed on the lower surface of the third build-up layer 121d, a fourth via layer 123d penetrating at least a portion of the third build-up layer 121d, a fourth build-up layer 121e disposed on the upper surface of the second build-up layer 121c, a fifth wiring layer 122e disposed on the upper surface of the fourth build-up layer 121e, a fifth via layer 123e penetrating at least a portion of the fourth build-up layer 121e, a fifth build-up layer 121f disposed on the lower surface of the third build-up layer 121d, a sixth wiring layer 122f disposed on the lower surface of the fifth build-up layer 121f, and a sixth via layer 123f penetrating at least a portion of the fifth build-up layer 121f. The first to fifth build-up layers 121A, 121c, 121d, 121e, and 121f described above may be collectively referred to as build-up layers, and in this case, the number of build-up layers may be changed.

In addition, the printed circuit board 100 according to an example may further include a first passivation layer 130 disposed on the upper surface of the fourth build-up layer 121e, and having a plurality of first openings 130h exposing at least a portion of the fifth wiring layer 122e, respectively, a second passivation layer 140 disposed on the lower surface of the fifth build-up layer 121f, and having a plurality of second openings 140h exposing at least a portion of the sixth wiring layer 122f, respectively, a plurality first electrical connection metal bumps 150 disposed on the plurality of first openings 130h, respectively, to be electrically connected to the exposed fifth wiring layer 122e, respectively, and a plurality of second electrical connection metal bumps 160 disposed on the plurality of second openings 140h, respectively, to be electrically connected to the exposed sixth wiring layer 122f, respectively.

As described above, CPUs, ASICs, APs, and the like, have recently been supplied with power from PMICs. In recent years, a power supply switching frequency of the PMICs has increased to improve power efficiency. Therefore, it may be considered to dispose an inductor on a mainboard separately from a package substrate on which an integrated circuit IC is surface mounted. However, in this case, a high capacity inductor is required, and in particular, since an electrical path between the inductor and the integrated circuit IC mounted on the package substrate is increased, resistance may be increased, thereby lowering power efficiency. Alternately, it may be considered to simply form a coil with a pattern in a package substrate. However, in this case, since the coil is formed in air, rather than a magnetic material, it may be difficult to implement capacitance, and a large area in the package substrate should be used to form a pattern coil, such that an overall size of the package substrate may be increased. Alternatively, it may be considered that an inductor in a form of dies is surface mounted on a bottom surface. However, in this case, a price of the inductor in the form of dies may be significantly high.

On the other hand, in the printed circuit board 100 according to an example, the core layer 111 has a through portion 111H, and the magnetic member 200 is disposed in the through portion 111H. The magnetic member 200 may be disposed in the through portion 111H. In addition, the magnetic member 200 may be embedded in a form in which at least a portion thereof is covered by the build-up layer, for example, a first build-up layer 121A. In addition, a first coil pattern 112A may be disposed above the magnetic member 200, and a second coil pattern 112B may be disposed therebelow. As such, since it has a form in which the magnetic member 200 is embedded, it is easy to implement a high capacity. For example, the magnetic member 200 may be a laminate including a magnetic layer 220 in which permeability can be kept high at high frequencies as described below. In addition, since coil patterns 112A and 112B are disposed to be adjacent to the magnetic member 200, an inductance performance may be improved.

The core layer 111 may be a core substrate, a center of the printed circuit board 100. As a material of the core layer 111, an insulating material may be used, and in this case, as the insulating material, a thermosetting resin such as an epoxy resin, a thermoplastic resin such as polyimide, or a material including a reinforcing material such as glass fiber (or glass cloth, glass fabric) and/or an inorganic filler, for example, a copper clad laminate (CCL), an unclad CCL, or the like may be used. However, the present disclosure is not limited thereto, a metal plate or a glass plate may be used as the core layer 111, and a ceramic plate may also be used. If necessary, a liquid crystal polymer (LCP) may be used as the material of the core layer 111. The core layer 111 may have a through portion 111H, and the magnetic member 200 may be disposed in the through portion 111H.

The magnetic member 200 may in a form of a laminate including a base layer 210 and a magnetic layer 220 disposed on the base layer 210. The base layer 210 may serve as a substrate when forming the magnetic layer 220. For example, the magnetic layer 220 may be formed by sputtering, and the magnetic layer 220 may be formed by staking atoms or molecules protruding from a target material on the surface of the base layer 210. The base layer 210 may include an insulating material, and may be, for example, prepreg, an Ajinomoto build-up film (ABF), or the like. Alternatively, the base layer 210 may be a silicon substrate of single crystal silicon (Si).

The magnetic layer 220 may include a ferromagnetic material to increase a magnetic field induced by the first and second coil patterns 112A and 112B. For example, the magnetic layer 220 may include a cobalt-tantalum-zirconium alloy, but is not limited thereto. When the magnetic layer 220 includes a cobalt-tantalum-zirconium alloy, the magnetic layer 220 may be formed by sputtering, and thus, the magnetic layer 220 may be formed to a thickness of a thin film, that is, several micrometers. The magnetic layer 220 may be composed of multiple layers or a plurality of layers. In the case of a plurality of layers, each layer may have a thickness of about 0.1 µm to about 3 µm, but is not limited thereto. Meanwhile, since the magnetic layer 220 is not formed directly on the printed circuit board, a magnetic layer 220 having a thin film level may be embedded. For example, after the base layer 210 is introduced into a thin film forming equipment to form the magnetic layer 220, the magnetic member 200 is cut to a required size and the cut magnetic member 200 is disposed in the through portion 111H of the core layer 111. Therefore, it can be embedded in the printed circuit board with any size without limitation, depending on a work size.

A metal material may be used as a material of the core wiring layers 112a and 112b, and in this case, as the metal material, copper (Cu), aluminum (Al), silver (Ag), tin (Sn), gold (Au), nickel (Ni), lead (Pb), titanium (Ti), alloys thereof, or the like may be used. The core wiring layers 112a and 112b may be formed using plating processes such as an additive process (AP), a semi additive process (SAP), a modified semi additive process (MSAP), tenting (TT), or the like, and as a result, the core wiring layers 112a and 112b may include a seed layer, an electroless plating layer, and an electrolytic plating layer formed based on the seed layer. The core wiring layers 112a and 112b may perform various functions depending on designs of corresponding layers. For example, the core wiring layers 112a and 112b may include a ground (GND) pattern, a power (PWR) pattern, a signal (S) pattern, and the like. Here, the signal(S) pattern includes various signals except for the ground pattern (GND) pattern, the power (PWR) pattern, and the like, such as a data signal. These patterns may include a line pattern, a plane pattern, and/or a pad pattern, respectively.

First and second coil patterns 112A and 112B may be disposed above and below the magnetic member 200, respectively, and may include a planar spiral structure 112C, as illustrated in FIG. 4. First and second coil patterns 112A and 112B may be disposed above and below the magnetic member 200, respectively, and may include a planar spiral structure 112C, as illustrated in FIG. 4. It means that the first and second coil patterns 112A and 112B may include independent coil layers having the same level, respectively. In other words, the first and second coil patterns 112A and 112B may be coils having a plurality of turns on the same plane, and according to this form, a thin and high inductance may be realized. The first coil pattern 112A may include terminal pads 112P extending from ends of the planar spiral structure 112C, respectively. In one example, one of the terminal pads 112P may be disposed on the upper insulating layer 121a of the first build-up layer 121A, on which the planar spiral structure 112C is disposed. Another of the terminal pads 112P may be disposed on the second build-up layer 121c, and connected to the planar spiral structure 112C through a via (not labeled) in the second build-up layer 121c. In one example, one or both of the terminal pads 112P may be omitted, and in this case, the planar spiral structure 112C may be directly connected to a wiring structure provided by the first wiring layer 122a, and/or the planar spiral structure 112C may be connected to a wiring structure provided by the wiring layer 122c through a via in the second build-up layer 121c. Here, FIG. 4 illustrates the first coil pattern 112A, but the second coil pattern 112B may have the same or similar shape. As such, the first and second coil patterns 112A and 112B may include spiral coil structures 112C that are independent of each other, and may not be directly connected to each other. Even if the first and second coil patterns 112A and 112B are not directly connected to each other, they may independently function as inductors.

As illustrated in FIG. 3, the first and second coil patterns 112A and 112B may share one magnetic member 200, and to this end, they may be disposed to be aligned in a thickness direction. In addition, the first and second coil patterns 112A and 112B may have the same or substantially the same width as each other, where a width of the coil pattern may mean a length from the center to an outermost pattern. Furthermore, the first and second coil patterns 112A and 112B may also have the same or substantially the same width as the magnetic member 200. Since the first and second coil patterns 112A and 112B are disposed to be adjacent to upper and lower portions of the magnetic member 200 in a form of sharing them, high inductance may be realized in a limited space of the printed circuit board 100.

A metal material may be used as a material of the first and second coil patterns 112A and 112B, and as the metal material, copper (Cu), aluminum (Al), silver (Ag), tin (Sn), gold (Au), nickel (Ni), lead (Pb), titanium (Ti), alloys thereof, or the like may be used. In this case, the first coil pattern 112A may be simultaneously formed through the above-described plating process when the first wiring layer 122a is formed, and the second coil pattern 112B may be simultaneously formed through the above-described plating process when the second wiring layer 122b is formed. As a result, the first and second coil patterns 112A and 112B may include a seed layer, an electroless plating layer and an electrolytic plating layer formed based on the seed layer.

A metal material may also be used as the material of the core via layer 113, and in this case, as the metal material, copper (Cu), aluminum (Al), silver (Ag), tin (Sn), gold (Au), nickel (Ni), lead (Pb), titanium (Ti), alloys thereof, or the like may be used. The core via layer 113 may also be formed by a plating process such as AP, SAP, MSAP, TT, or the like. As a result, the core via layer 113 may include a seed layer, an electroless plating layer, and an electrolytic plating layer formed based on the seed layer. The wiring via of the core via layer 113 may be completely filled with a metal material, respectively, or the metal material may be formed along a wall surface of the via hole. In addition, all known shapes such as an hourglass shape, a cylindrical shape, or the like may be applied. The core via layer 113 may also perform various functions due to designs of corresponding layers. For example, the core via layer 113 may include a wiring via for signal connection, a wiring via for ground connection, a wiring via for power connection, and the like. The wiring via for ground connection and the wiring via for power connection may be the same wiring via.

The build-up layers 121A, 121c, 121d, 121e, and 121f may provide insulating regions for forming multilayer wirings on both sides of the core layer 111. An insulating material may be used as a material of the build-up layers 121A, 121c, 121d, 121e, and 121f. In this case, as the insulating material, a thermosetting resin such as an epoxy resin, a thermoplastic resin such as polyimide, or a material including a reinforcing material such as an inorganic filler together with the above resin materials, for example, prepreg, an Ajinomoto Build-up Film (ABF) may be used. If necessary, a Photoimageable Dielectric (PID) may be used as the material of the build-up layers 121A, 121c, 121d, 121e, and 121f. Meanwhile, the build-up layers 121A, 121c, 121d, 121e, and 121f may include the same material as each other, or may include different materials from each other. Boundaries of the build-up layers 121A, 121c, 121d, 121e, and 121f may be clear or unclear. The first build-up layer 121A may include an upper insulating layer 121a and a lower insulating layer 121b, and both may be integrated with each other, such that a boundary thereof may be clear or unclear.

A metal material may be used as a material of wiring layers 122a, 122b, 122c, 122d, 122e, and 122f, and in this case, as the metal material, copper (Cu), aluminum (Al), silver (Ag), tin (Sn), Gold (Au), nickel (Ni), lead (Pb), titanium (Ti), alloys thereof, or the like may be used. The wiring layers 122a, 122b, 122c, 122d, 122e, and 122f may be formed by plating processes such as AP, SAP, MSAP, and TT, respectively, and as a result, may include a seed layer, an electroplating layer, and an electrolytic plating layer formed based on the seed layer. The wiring layers 122a, 122b, 122c, 122d, 122e, and 122f may perform various functions depending on designs of corresponding layers. For example, the wiring layers 122a, 122b, 122c, 122d, 122e, and 122f may include a ground (GND) pattern, a power (PWR) pattern, a signal (S) pattern, and the like. Here, the signal(S) pattern includes various signals except for the ground pattern (GND) pattern, the power (PWR) pattern, and the like, such as a data signal. If necessary, the ground (GND) pattern and the power (PWR) pattern may be the same pattern as each other. These patterns may include a line pattern, a plane pattern, and/or a pad pattern, respectively.

A metal material may also be used as a material of the via layers 123a, 123b, 123c, 123d, 123e, and 123f. In this case, as the metal material, copper (Cu), aluminum (Al), silver (Ag), tin (Sn), gold (Au), nickel (Ni), lead (Pb), titanium (Ti), alloys thereof, or the like may be used. The via layers 123a, 123b, 123c, 123d, 123e, and 123f may be formed by using a plating process such as an additive process (AP), a semi AP (SAP), a modified SAP (MASP), tenting (TT), or the like, respectively. As a result, the via layers 123a, 123b, 123c, 123d, 123e, and 123f may include a seed layer, an electroless plating layer, and an electrolytic plating layer formed based on the seed layer. The wiring via of the via layers 123a, 123b, 123c, 123d, 123e, and 123f may be completely filled with a metal material, respectively, or the metal material may be formed along a wall surface of a via hole. In addition, all known shapes in the art such as a tapered shape, or the like, may be applied. For example, the wiring vias of the first, third, and fifth via layers 123a, 123c, and 123e and the wiring vias of the second, fourth, and sixth via layers 123b, 123d, and 123f may have tapered shapes in opposite directions. The via layers 123a, 123b, 123c, 123d, 123e, and 123f may also perform various functions due to designs of corresponding layers. For example, a wiring via for signal connection, a wiring via for ground connection, a wiring via for power connection may be included. The wiring via for ground connection and the wiring via for power connection may be the same wiring via.

The passivation layers 130 and 140 may protect an internal configuration of the printed circuit board 100 according to an example from external physical and chemical damages. The passivation layers 130 and 140 may include a thermosetting resin. For example, the passivation layers 130 and 140 may be ABFs. However, the present disclosure is not limited thereto, and the passivation layers 130 and 140 may be a known solder resist (SR) layer, respectively. In addition, if necessary, a PID may be included. The passivation layers 130 and 140 may have a plurality of openings 130h and 140h, respectively, and the plurality of openings 130h and 140h may expose at least portions of the fifth and sixth wiring layers 122e and 122f, which are uppermost and lowermost wiring layers of the printed circuit board 100 according to an example, respectively. Meanwhile, a surface treatment layer may be formed on the surfaces of the exposed fifth and sixth wiring layers 122e and 122f. The surface treatment layer may be formed by, for example, electrolytic gold plating, electroless gold plating, OSP or electroless tin plating, electroless silver plating, electroless nickel plating/substituting gold plating, DIG plating, HASL, or the like. If necessary, each of the openings 130h and 140h may be composed of a plurality of via holes. If necessary, an underbump metal (UBM) may be disposed on each of the openings 130h and 140h to improve reliability.

The electrical connection metal bumps 150 and 160 are a configuration that can physically and/or electrically connect the printed circuit board 100 externally. For example, an electronic component 320 may be mounted on the printed circuit board 100 according to an example through a first electrical connection metal 150. In addition, the printed circuit board 100 according to an example may be mounted on a mainboard of the electronic device through a second electrical connection metal 160. For example, the printed circuit board 100 according to an example may be a package substrate of a ball grid array (BGA) type. The electrical connection metal bumps 150 and 160 may be disposed on the plurality of openings 130h and 140h of the passivation layers 130 and 140, respectively. The electrical connection metal bumps 150 and 160 may be composed of a low melting point metal having a lower melting point than copper (Cu), respectively, for example, tin (Sn) or an alloy containing tin (Sn). For example, the electrical connection metal bumps 150 and 160 may be formed of a solder, but this is merely an example, and a material thereof is not limited thereto.

The electrical connection metal bumps 150 and 160 may be lands, balls, pins, or the like. The electrical connection metal bumps 150 and 160 may be formed as multilayer structures or single layer structures. When the electrical connection metal bumps 150 and 160 are formed of multilayer structures, the electrical connection metal bumps 150 and 160 may include a copper pillar and a solder. When the electrical connection metal bumps 150 and 160 are formed of a single layer structure, the electrical connection metal bumps 150 and 160 may include a tin-silver solder, but this is merely an example, and the present disclosure is not limited thereto. The number, an interval, a dispositional form, and the like, of the electrical connection metal bumps 150 and 160 are not particularly limited, but may be sufficiently modified depending on design particulars by those skilled in the art. The second electrical connection metal 160 may be for being mounted on the mainboard, and thus the number of the second electrical connection metal bumps 160 may be greater than the number of the first electrical connection metal bumps 150, and the sizes of the second electrical connection metal bumps 160 may be greater than the size of the first electrical connection metal bumps 150. In this regard, the numbers of the plurality of second openings 140h may be larger than the numbers of the plurality of first openings 130h, and the sizes of the plurality of second openings 140h may be larger than the sizes of the plurality of first openings 130h.

A capacitor 310 may be a chip type component including a body 311 having an internal electrode and first and second external electrodes 312 and 313 disposed to be spaced apart from each other on the body 311. For example, the capacitor 310 may be a multilayer ceramic capacitor (MLCC), but is not limited thereto. The first and second external electrodes 312 and 313 may be electrically connected to at least a portion of the first wiring layer 122a, through the wiring via of the first via layer 113a, respectively.

An electronic component 320 may be a known active component or passive component. For example, the electronic component 320 may be a semiconductor chip or a semiconductor package including the semiconductor chip. However, the present disclosure is not limited thereto, and it may be other known surface mounting components.

A printed circuit board according to another embodiment of the present disclosure will be described with reference to FIGS. 5 to 12, and descriptions will be mainly made on a portion changed from the above-described embodiments.

Figure 5:
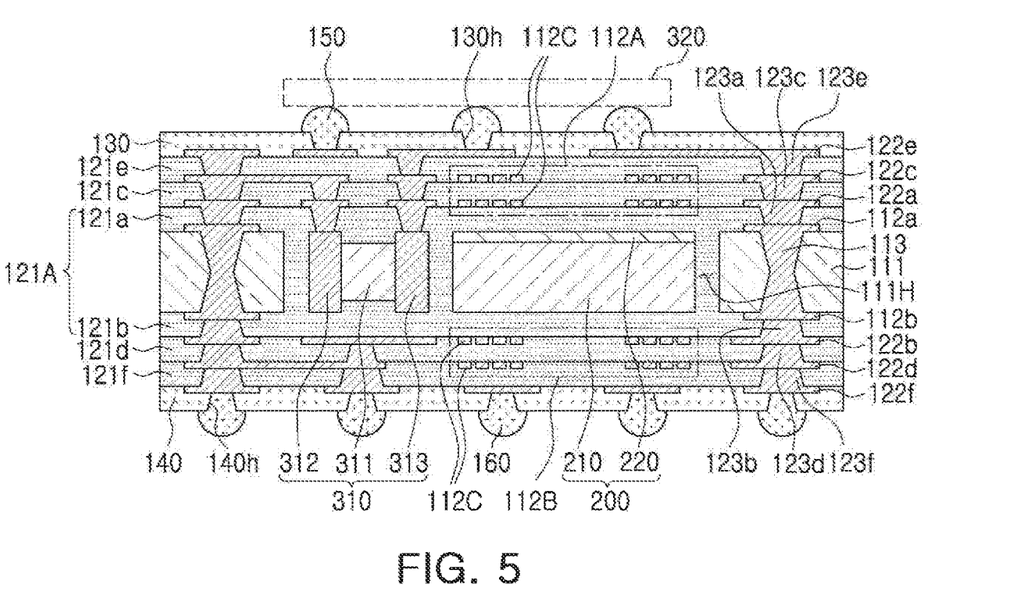
FIGS. 5 to 12 are views illustrating a printed circuit board according to another embodiment of the present disclosure.
Figure 6:
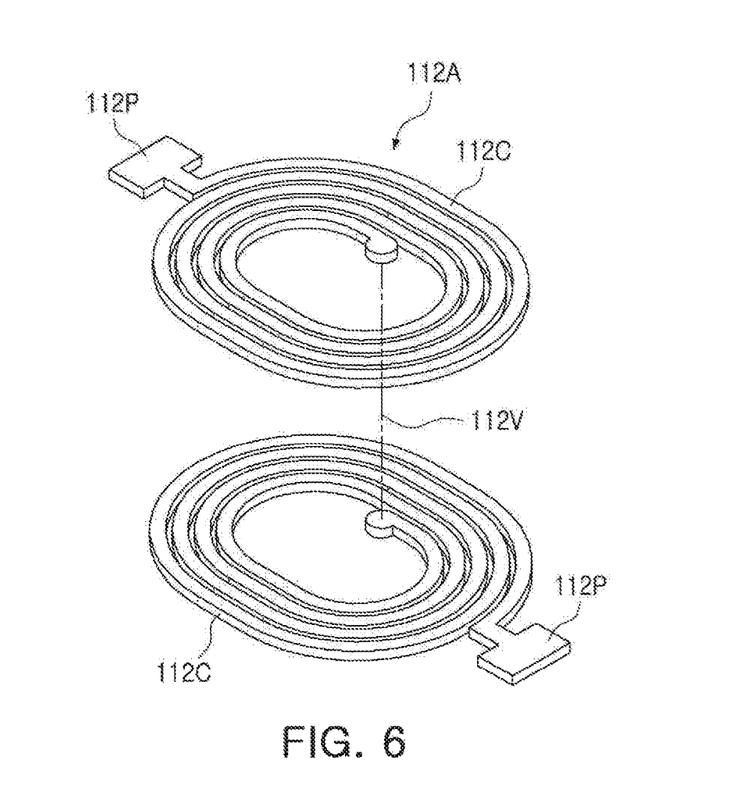

First, in the embodiments of FIGS. 5 and 6, the first and second coil patterns 112A and 112B may be provided with a plurality of the planar spiral structures 112C, respectively, and the plurality of planar spiral structures 112C may be implemented in stacked form in a thickness direction of the printed circuit board. That is, in the first coil pattern 112A, multiple coil layers may be connected to form one coil structure, the same with the second coil pattern 112B. To this end, as illustrated, each of the plurality of planar spiral structure 112C in the first and second coil patterns 112A and 112B may be connected to each other by conductive vias 112V. As in the present embodiment, when the first and second coil patterns 112A and 112B include multiple coil layers, respectively, the number of turns of the coil may be increased, thereby improving inductance characteristics.

Figure 7:
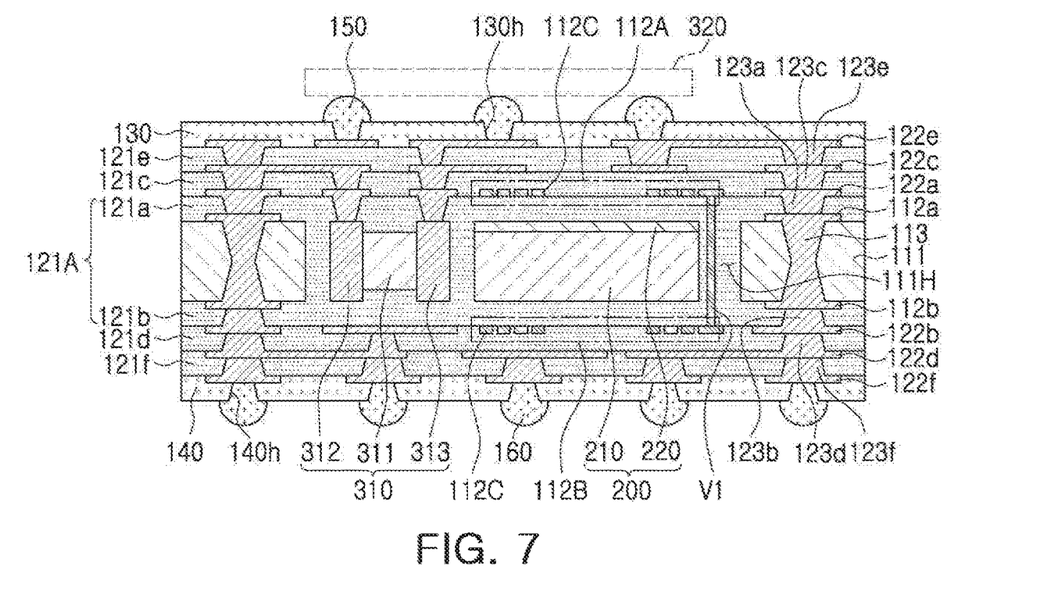
Figure 8:
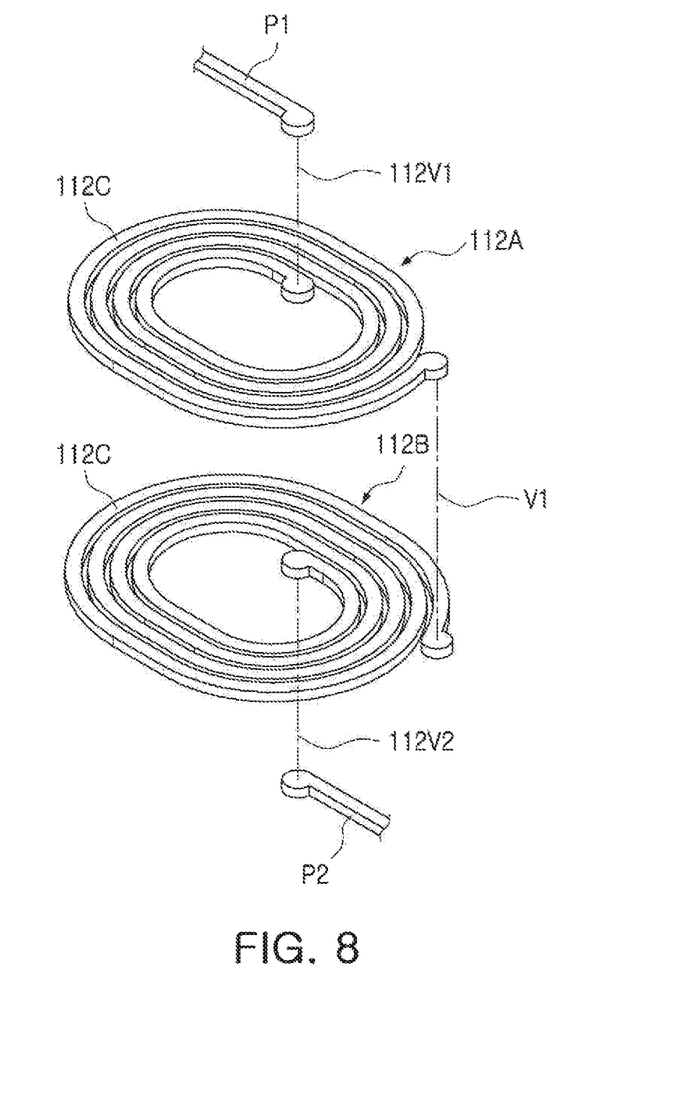

Next, in embodiments of FIGS. 7 and 8, the first and second coil patterns 112A and 112B may be connected by a conductive via V1, from which the first and second coil patterns 112A and 112*b* may form one coil structure as a whole. In this case, as illustrated, the conductive via V1 may be disposed to be adjacent to the side surface of the magnetic member 200. In addition, the conductive via V1 may connect outermost end portions (corresponding to a pad region having a wide width connected by V1 in FIG. 8) of each of the first and second coil patterns 112A and 112B. In the present embodiment, since the remaining end portions of the first and second coil patterns 112A and 112B are located on innermost sides of each of the first and second coil patterns 112A and 112B, the printed circuit board may be provided with conductive patterns P1 and P2 disposed on a different level therefrom. Specifically, the conductive pattern P1 disposed on a different level from the first coil pattern 112A (an example disposed above is illustrated in FIG. 8) may be connected to the innermost end portion of the first coil pattern 112A by a conductive via 112V1. In addition, the conductive pattern P2 disposed on a different level from the second coil pattern 112B (an example disposed below is illustrated in FIG. 8) may be connected to the innermost end portion of the second coil pattern 112B by a conductive via 112V2.

Figure 9:
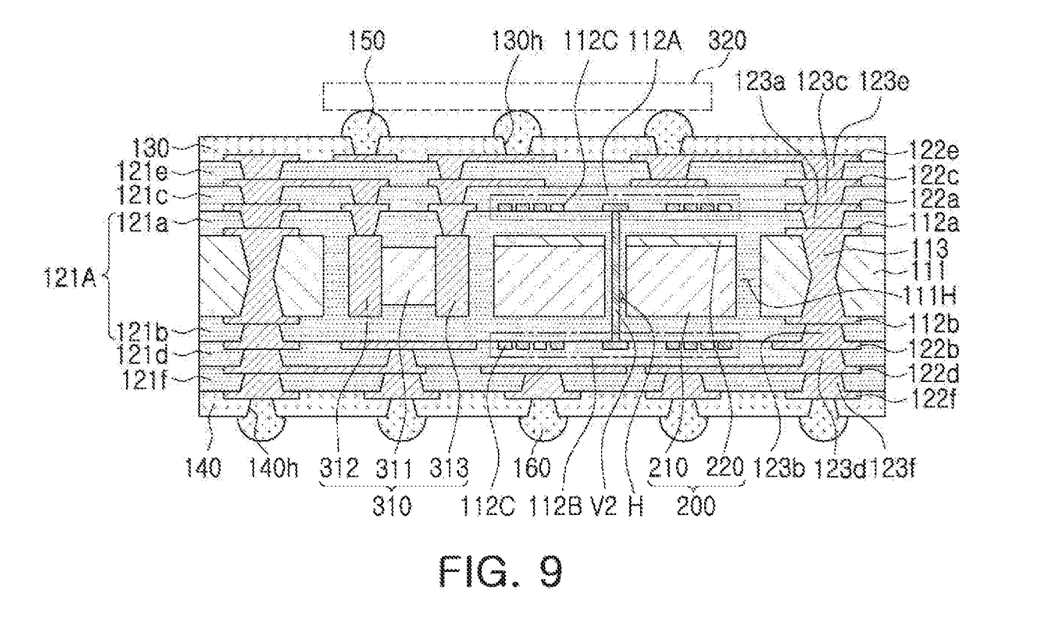
Figure 10:
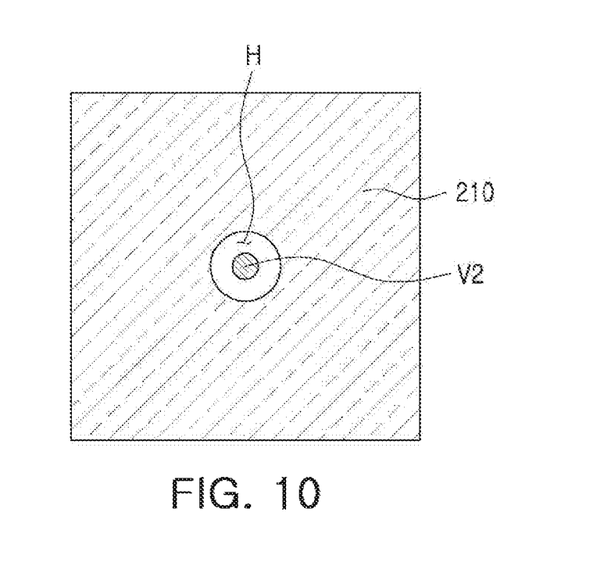
Figure 11:
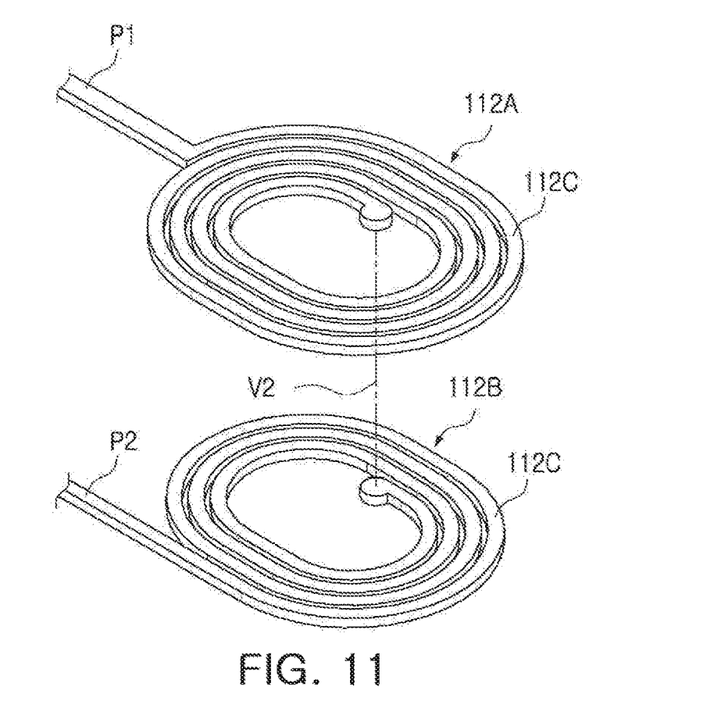

Next, in embodiments of FIGS. 9 to 11, the first and second coil patterns 112A and 112B may be connected by conductive vias V2, from which the first and second coil patterns 112A and 112B may form a coil structure as a whole. In this case, as illustrated, the conductive via V2 may be implemented to penetrate the magnetic member 200. When the conductive via V2 penetrates the magnetic member 200 to connect the first and second coil patterns 112A and 112B, as illustrated in FIG. 11, the conductive via V2 may connect innermost end portions (corresponding to a width to a pad region having a wide width connected by V2 in FIG. 11) of each of the first and second coil patterns 112A and 112B. The other end portion of the first coil pattern 112A may be connected to the conductive pattern P1, and in this case, they may be disposed on the same plane. In addition, the other end portion of the second coil pattern 112B may be connected to the conductive pattern P2, and in this case, they may be disposed on the same plane.

Figure 12:
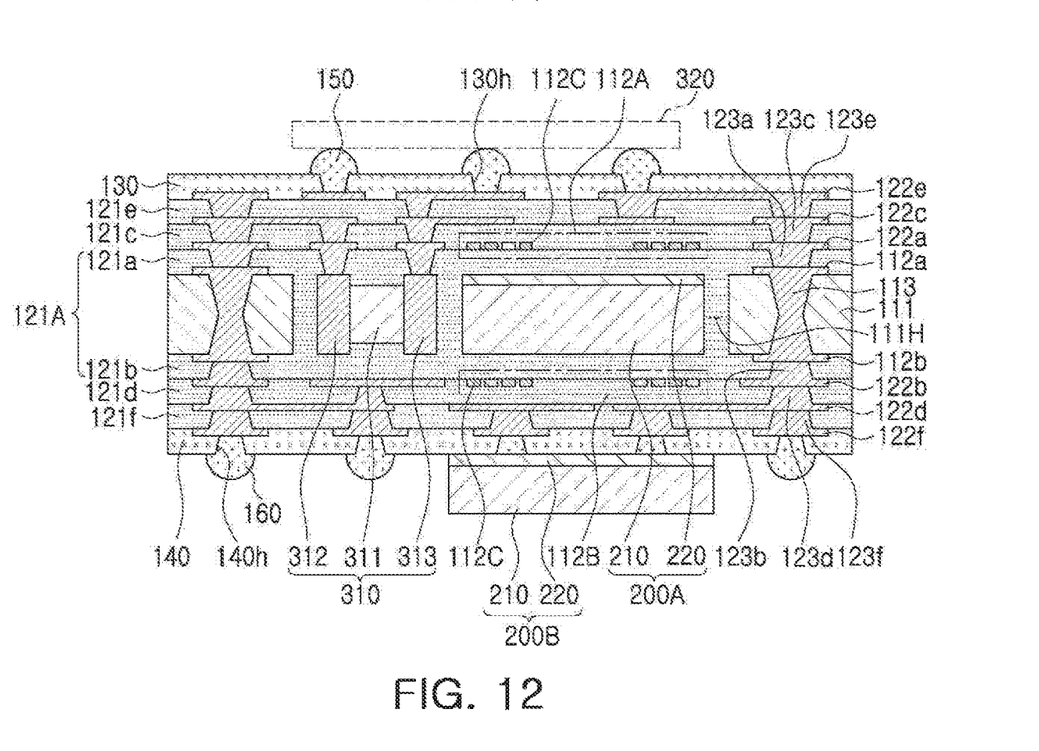

Next, in the embodiment shown in FIG. 12, the printed circuit board includes a plurality of magnetic members 200A and 200B. That is, the magnetic members 200A and 200B may be provided as a plurality of magnetic members, and a portion of the magnetic members, for example, the first magnetic member 200A, may be disposed in the through portion 111H, and a portion of remaining magnetic members, for example, the second magnetic member 200B, may be disposed outside build-up layers 121A, 121*c*, 121*d*, 121*e*, and 121*f*. In this case, as illustrated, the second magnetic member 200B may be implemented in a form mounted below the printed circuit board, and a position of the second magnetic member 200B may be changed as necessary. For example, the second magnetic member 200B may be disposed below and/or above the printed circuit board. By employing the plurality of magnetic members 200A and 200B and disposing the plurality of magnetic members 200A and 200B such that the first and second coil patterns 112A and 112B share, an inductance characteristic of the printed circuit board may be further improved. Meanwhile, although sizes of the first and second magnetic members 200A and 200B are different from each other in FIG. 12, the first and second magnetic members 200A and 200B may have the same size. However, the size of the first magnetic member 200A embedded in the printed circuit board may be smaller than the size of the second magnetic member 200B disposed outside.

As set forth above, in the case of the printed circuit board according to an embodiment of the present disclosure, a path between an IC chip and an inductor may be minimized by embedding the inductor, and permeability of the inductor may be kept high even at high frequencies.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of various of effects of the present disclosure, a printed circuit board including a wiring which may have high adhesion to an insulating layer may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a magnetic member including a magnetic layer;
a first coil pattern disposed above the magnetic member, and including a planar spiral structure;
a second coil pattern disposed below the magnetic member, and including a planar spiral structure;
a core layer having a through portion; and
a build-up layer covering at least a portion of each of the core layer, the magnetic member, and the first coil pattern, and disposed in at least a portion of the through portion.

2. The printed circuit board of claim 1, wherein the magnetic member is disposed in the through portion.

3. The printed circuit board of claim 1, wherein the magnetic member is provided as a plurality of magnetic members, and a portion of the plurality of magnetic members are disposed in the through portion, and a portion of remaining magnetic members are disposed outside of the build-up layer.

4. The printed circuit board of claim 1, wherein the first and second coil patterns are provided with a plurality of the planar spiral structures, respectively, and the plurality of planar spiral structures are stacked in a thickness direction of the printed circuit board.

5. The printed circuit board of claim 4, wherein each of the plurality of planar spiral structures in the first and second coil patterns is connected to each other by conductive vias.

6. The printed circuit board of claim 1, wherein the first and second coil patterns comprise two pads for electrical connections, respectively, and the first and second coil patterns are not directly connected.

7. The printed circuit board of claim 1, wherein the first and second coil patterns are connected to each other by a conductive via.

8. The printed circuit board of claim 7, wherein the conductive via is disposed to be adjacent to a side surface of the magnetic member.

9. The printed circuit board of claim 8, wherein the conductive via connects an outermost end portion of each of the first and second coil patterns.

10. The printed circuit board of claim 7, wherein the conductive via penetrates the magnetic member.

11. The printed circuit board of claim 10, wherein the conductive via connects an innermost end portion of each of the first and second coil patterns.

12. The printed circuit board of claim 1, further comprising first and second core wiring layers disposed on one surface and the other surface of the core layer, respectively, and in which at least a portion thereof is covered by the build-up layer, and a core via layer penetrating at least a portion of the core layer.

13. The printed circuit board of claim 1, wherein each of the magnetic member, the first coil pattern, and the second coil pattern is embedded in the printed circuit board.

14. A printed circuit board, comprising:
a magnetic member including a magnetic layer;
a first coil pattern disposed above the magnetic member, and including a planar spiral structure; and
a second coil pattern disposed below the magnetic member, and including a planar spiral structure,
wherein the magnetic member comprises a base layer and the magnetic layer disposed on the base layer.

15. The printed circuit board of claim 14, wherein the base layer is a substrate containing silicon (Si).

16. The printed circuit board of claim 14, wherein the magnetic layer comprises a cobalt-tantalum-zirconium alloy.

17. A printed circuit board, comprising:
a core layer;
a plurality of build-up layers and a plurality of wiring layers disposed on opposing sides of the core layer;
a magnetic member including a magnetic layer and embedded in the core layer; and
a first coil pattern and a second coil pattern each having a planar spiral structure and overlapping the magnetic member in a stacking direction of the plurality of build-up layers,
wherein the first coil pattern is directly disposed on one of the build-up layer on which one of the plurality of wiring layers is directly disposed, and
the second coil pattern is directly disposed on another of the build-up layer on which another of the plurality of wiring layers is directly disposed.

18. The printed circuit board of claim 17, wherein the first and second coil patterns are connected to each other through a via penetrating through at least the magnetic member.

19. The printed circuit board of claim 17, wherein the first and second coil patterns are connected to each other through a via extending in the stacking direction in a region outside the magnetic member.

20. A printed circuit board, comprising:
a magnetic member including a magnetic layer;
a first coil pattern disposed above the magnetic member, and including a planar spiral structure; and
a second coil pattern disposed below the magnetic member, and including a planar spiral structure,
wherein the first and second coil patterns comprise two pads for electrical connections, respectively, and the first and second coil patterns are not directly connected.

* * * * *